(12) United States Patent
Moore

(10) Patent No.: US 6,951,805 B2
(45) Date of Patent: Oct. 4, 2005

(54) METHOD OF FORMING INTEGRATED CIRCUITRY, METHOD OF FORMING MEMORY CIRCUITRY, AND METHOD OF FORMING RANDOM ACCESS MEMORY CIRCUITRY

(75) Inventor: John T. Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 243 days.

(21) Appl. No.: 09/921,518

(22) Filed: Aug. 1, 2001

(65) Prior Publication Data

US 2003/0027416 A1 Feb. 6, 2003

(51) Int. Cl.[7] .......................................... H01L 21/4763
(52) U.S. Cl. ........................ 438/618; 438/637; 438/667
(58) Field of Search ................................ 438/618, 622, 438/637, 652, 667, 674, 675, 623, 629, 630, 634, 645, 647, 648, 6, 210, 240, 382

(56) References Cited

U.S. PATENT DOCUMENTS

| 3,271,591 A | 9/1966 | Ovshinsky |
| 3,622,319 A | 11/1971 | Sharp ............................. 96/27 |
| 3,743,847 A | 7/1973 | Boland ........................ 250/510 |

(Continued)

FOREIGN PATENT DOCUMENTS

| JP | 56126916 | 10/1981 |
| JP | 56126916 A | 10/1981 |
| WO | WO 97/48032 | 12/1997 |
| WO | WO 99/28914 | 6/1999 |
| WO | WO 00/48196 | 8/2000 |
| WO | 00/48196 A1 | 8/2000 |
| WO | WO 02/21542 | 3/2002 |
| WO | 02/21542 A1 | 3/2002 |

OTHER PUBLICATIONS

U.S. Appl. No. 09/732,968, filed Dec. 8, 2000, Gilton.
U.S. Appl. No. 09/779,983, filed Feb. 8, 2001, Moore.
U.S. Appl. No. 09/797,635, filed Mar. 1, 2001, Moore et al.
U.S. Appl. No. 09/943,187, filed Aug. 21, 2001, Campbell et al.
U.S. Appl. No. 09/943,190, filed Aug. 21, 2001, Campbell et al.
U.S. Appl. No. 09/943,199, filed Aug. 29, 2001, Campbell et al.
U.S. Appl. No. 09/999,883, filed Oct. 31, 2001, Gilton et al.
Axon Technologies Corporation, *Programmable Metallization Cell (PMC)*, pp. 1–6 (pre–2000).
Hirose et al., *High Speed Memory Behavior and Reliability of an Amorphous $As_2S_3$ Film Doped With Ag*, Physica Status Solidi (a) 61, pp. K187–K190 (Jul. 17, 1980).
Hirose et al., *Polarity–dependent memory switching and behavior of Ag dendrite in Ag–photodoped $AS_s S_3$ films*, 47 J. Appl. Phys. No. 6, pp. 2767–2772 (Jun. 1976).

(Continued)

Primary Examiner—Phuc T. Dang
(74) Attorney, Agent, or Firm—Dickstein Shapiro Morin & Oshinsky LLP

(57) ABSTRACT

A method of forming memory circuitry sequentially includes forming a plurality of metal interconnect lines over a semiconductive substrate. A plurality of memory cell storage devices comprising voltage or current controlled resistance setable semiconductive material are then formed. In one implementation, a method of forming integrated circuitry includes forming a metal interconnect line over a semiconductive substrate. A device comprising two metal comprising electrodes separated by a voltage or current controlled resistance setable semiconductive material is formed. The resistance setable a semiconductive material is formed after forming the metal interconnect line.

87 Claims, 5 Drawing Sheets

U.S. PATENT DOCUMENTS

| | | | |
|---|---|---|---|
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | 430/323 |
| 4,312,938 A | 1/1982 | Drexler et al. | 430/496 |
| 4,316,946 A | 2/1982 | Masters et al. | |
| 4,320,191 A | 3/1982 | Yoshikawa et al. | 430/296 |
| 4,405,710 A | 9/1983 | Balasubramanyam et al. | 430/311 |
| 4,419,421 A | 12/1983 | Wichelhaus et al. | 429/191 |
| 4,499,557 A | 2/1985 | Holmberg et al. | 365/163 |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | 427/96 |
| 4,800,526 A | 1/1989 | Lewis | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Silwa et al. | 357/67 |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | 257/4 |
| 5,219,788 A | 6/1993 | Abernathey et al. | 437/187 |
| 5,238,862 A | 8/1993 | Blalock et al. | 437/52 |
| 5,272,359 A | 12/1993 | Nagasubramanian et al. | |
| 5,296,716 A | 3/1994 | Ovshinsky et al. | |
| 5,314,772 A | 5/1994 | Kozicki | |
| 5,315,131 A | 5/1994 | Kishimoto et al. | 257/57 |
| 5,335,219 A | 8/1994 | Ovshinsky et al. | |
| 5,341,328 A | 8/1994 | Ovshinsky et al. | |
| 5,350,484 A | 9/1994 | Gardner et al. | 156/628 |
| 5,359,205 A | 10/1994 | Ovshinsky | |
| 5,360,981 A | 11/1994 | Owen et al. | 257/4 |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | 427/498 |
| 5,512,773 A | 4/1996 | Wolf et al. | 257/471 |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A * | 3/1998 | Takaishi | |
| 5,751,012 A | 5/1998 | Wolstenholme et al. | 257/5 |
| 5,761,115 A | 6/1998 | Kozicki et al. | 365/182 |
| 5,789,277 A | 8/1998 | Zahorik et al. | 438/95 |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | 257/3 |
| 5,846,889 A | 12/1998 | Harbison et al. | 501/40 |
| 5,851,882 A | 12/1998 | Harshfield | |
| 5,869,843 A | 2/1999 | Harshfield | |
| 5,896,312 A | 4/1999 | Kozicki et al. | 365/153 |
| 5,912,839 A | 6/1999 | Ovshinsky et al. | |
| 5,914,893 A | 6/1999 | Kozicki et al. | 365/107 |
| 5,920,788 A | 7/1999 | Reinberg | 438/466 |
| 5,933,365 A | 8/1999 | Klersy et al. | |
| 5,998,066 A | 12/1999 | Block et al. | 430/5 |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | 438/128 |
| 6,084,796 A | 7/2000 | Kozicki et al. | 365/143 |
| 6,087,674 A | 7/2000 | Ovshinsky et al. | |
| 6,117,720 A | 9/2000 | Harshfield | 438/238 |
| 6,141,241 A | 10/2000 | Ovshinsky et al. | |
| 6,143,604 A * | 11/2000 | Chiang et al. | |
| 6,177,338 B1 * | 1/2001 | Liaw et al. | |
| 6,236,059 B1 | 5/2001 | Wolstenholme et al. | 257/3 |
| RE37,259 E | 7/2001 | Ovshinsky | |
| 6,297,170 B1 | 10/2001 | Gabriel et al. | 438/738 |
| 6,300,684 B1 | 10/2001 | Gonzalez et al. | 257/774 |
| 6,316,784 B1 | 11/2001 | Zahorik et al. | 257/3 |
| 6,329,606 B1 | 12/2001 | Freyman et al. | 174/260 |
| 6,339,544 B1 | 1/2002 | Chiang et al. | |
| 6,348,365 B1 | 2/2002 | Moore et al. | 438/130 |
| 6,350,679 B1 * | 2/2002 | McDaniel et al. | |
| 6,376,284 B1 | 4/2002 | Gonzalez et al. | 438/129 |
| 6,388,324 B2 | 5/2002 | Kozicki et al. | |
| 6,391,688 B1 | 5/2002 | Gonzalez et al. | 438/128 |
| 6,404,665 B1 | 6/2002 | Lowrey et al. | |
| 6,414,376 B1 | 7/2002 | Thakur et al. | 257/640 |
| 6,418,049 B1 | 7/2002 | Kozicki et al. | 365/174 |
| 6,420,725 B1 | 7/2002 | Harshfield | |
| 6,423,628 B1 | 7/2002 | Li et al. | 438/622 |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowrey | |
| 6,507,061 B1 | 1/2003 | Hudgens | |
| 6,511,862 B2 | 1/2003 | Hudgens et al. | |
| 6,511,867 B2 | 1/2003 | Lowrey et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowrey et al. | |
| 6,555,860 B2 | 4/2003 | Lowrey et al. | |
| 6,563,164 B2 | 5/2003 | Lowrey et al. | |
| 6,566,700 B2 | 5/2003 | Xu | |
| 6,567,293 B1 | 5/2003 | Lowrey et al. | |
| 6,569,705 B2 | 5/2003 | Chiang et al. | |
| 6,570,784 B2 | 5/2003 | Lowrey | |
| 6,576,921 B2 | 6/2003 | Lowrey | |

| | | |
|---|---|---|
| 6,586,761 B2 | 7/2003 | Lowrey |
| 6,589,714 B2 | 7/2003 | Maimon et al. |
| 6,590,807 B2 | 7/2003 | Lowrey |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowrey et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowrey et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowrey |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Johnson et al., *Lateral Diffusion in Ag–Se Thin–Film Couples*, 40 J. Appl. Phys. No. 1, pp. 149–152 (Jan. 1969).

Kawaguchi et al., *Optical, electrical, and structural properties of amorphous Ag–Ge–S anf Ag–Ge–Se films and . . .*, 79 J. Appl. Phys., No. 12, pp. 9096–9104 (Jun. 1996).

Kluge et al., *Silver photodiffusion in amorphous $Ge_x Se_{100-x}$*, 124 Journal of Non–Crystilline Solids, pp. 186–193 (1990).

Kolobov et al., *Photodoping of amorphous chalcogenides by metals*, 40 Advances in Physics, No. 5, pp. 625–684 (1991).

Mitkova et al., *Dual Chemical Role of Ag as an Additive in Chalcogenide Glasses*, 83 Physical Review Letters, No. 19, pp. 3848–3851 (Nov. 8, 1999).

Mitkova, *Real Time Optical Recording on Thin Films of Amorphous Semiconductors*, Insulating and Semiconducting Glasses, pp. 813–843 (P. Boolchand ed., World Scientific 2000).

Shimaka et al., *Photoinduced effects and metastability in amorphous semiconductors and Insulators*, 44 Advances in Physics, No. 6, pp. 475–588 (1995).

Abdel–All, A; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Laibib, H.H.; El–Fazary, M.H.; Fadel, M., Electrical and thermal properties of chalcogenide glass system Se75Ge25–x–Sbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadshleva, G.S., Current–Voltage characteristics of Ag2Se single crystal near the phase transition, Inorganic Materials 23 (1987) 137–139.

Aleksiejunas, A.; Cesnys, A., Swithcing phenomenon and memory effect in thin–film heterojunction of polycrystalline selenium–silver selenide, Phys. Stat. Sol. (a) 19(1973) K169–K171.

Angell, C.A. Mobile ions in amorphous solids. Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R. Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S. Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sci. (a)57 (1980)K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't E.; El Bouchairi, B.; Goureax, G., Polarized memory switching effects in Ag2Se/Se/M thin film sandwiches, Thin solid films 97 (1982) 165–171.

Bernede, J.C.; Khelil, A.; Kettaf, M.; Conan, A, Transition from S– to N–type differential negative resistance in Al–Al2O3–Ag2–xSe1+ thin film structures, Phys. Stat. Sci. (a) 74 (1982) 217–224.

Bondarev, V.N.; Pikhitsa, P.V., A dendrite model of current instability in RbAg4I5, Solid State Ionics 70/71 (1994) 72–78.

Boolchand, P., The maximum in glass transition temperture (Tg) near x=1/3 in GexSe1–x Glasses, Asian Journal of Physics (2000) 9, 709–72.

Boolchand P.; Basser, W.J. Mobile silver ions and glass formation in solid electrolytes, Nature 410 (2001) 1070–1073.

Boolchaud, P.; Georgiev, D.G.; Goodman, B., Discovery of the Intermediate Phase in Chalcogenide Glasses, J Opto-electronics and Advanced Materials, 3 (2001), 703.

Boolchand, P.; Selvanathan, D. Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural orgin of broken chemical order in a GeSe2 glass, Phys. Rev. B25 (1982) 2975–2978.

Boolchand, P.; Grothaus, J.; Phillips, J.C., Broken chemical order and phase separation in GexSe1–x glasses, Solid state comm. 45 (1983) 1983–185.

Boolchand, P., Bresser, W.J., Compositional trends in glass transition temperature (Tg), network connectivity and nanoscale chemical phase separation in chalcogenides, Dept. pf ECECS, Univ. Cincinnati (Oct. 28, 1999) 45221–0030.

Boolchand, P.; Grothaus, J. Molecular Structure of Melt–Quenched GeSe2 and GeS2 glasses compared, Proc. Int. Conf. Phys. Semicond. (Eds. Chadi and Harrison) 17th (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P. Intrinscially broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Tetnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300k, J. Appl. Phys. 38 (1967) 753–756.

Davis, E.A., Semiconductors without form, Search 1 (1970) 152–155.

Deamaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properities, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z,; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "In–situ" resistance measurements vs time, Phys. Stat. Sol. (a) 123 (1991) 451–460.

El–kady, Y.L., The threshold switching in semiconductiong glass Ge21Se17Te62, Indian J. Phys. 70A (1996) 507–516.

Elliott, S.R., A unified mechansim for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of $Ge20BixSe80-x$ films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of $Se75Ge7Sb18$, Vacuum 43 (1992) 253–257.

Feng, X.; Bresser, W.J., Boolchand, P., Direct evidence for stiffness threshold in Chalcogenide glasses, Phys. Rev. Lett. 78 (1997) 4422–4425.

Feng, X.; Bresser, W.J.; Zhang, M., Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A; Fuoss, P.H.; Marcus, M.A., Structure and bonding in photodiffused amorphous Ag–GeSe2 thin films, Phys. Rev. B 38 (1988) 12388–12403.

Fleury, G.; Harnou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiductors, Annual Review of Materials Science 2 (1972) 697–744.

Gates, B.; Wu, Y.; Yang. P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Kervin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J–P.; Rouxel, T.; Sangleboeuf, J.–C; Melscoet, I.; Lucas, J., Hardness, toughness, and J. scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M.; DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1998) 825–828.

Hajto, J.; Owen, A.E.; Snell, A.J.; Le Comber, P.G.; Rose, M.J., Analogue memory and ballistic electon effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fabel, M.; Sedeek, K. Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic of glassy $GexSe1-x$ around the stiffness threshold compostion, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajito, J.; Snell, A.J.; Owen, A.E.; Rose, M.J., Capacitance anormaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ga/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J. On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of chang in optical transmission spectra resulting from Ag photodoping in chalcogenid film, Japn. J. Appl. Phys. 26 (1987) 15–21.

Kawasaki, M.; Kawanura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A; Klabes, R.; Grotzshel, R., Silver photodiffusion in amorphous GexSe100–x, J. Non–Cryst. Solids 124 (1990) 186–193.

Kolobov, A.V., On the orgin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andrelchin,R.E., Chalcogenide glass polarization and the type of contacts, J. Non–Cryst. Solids 1994 (1996) 256–259.

Kotkata, M.F.; Afif, M.A.; Labib, H.H.; Hegab, N.A.; Abdel–Aziz, M.M., Memory switching in amorphous GeSeTi chalcogenide semiconductor films, Thin Solid Films 240 (1994) 143–146.

Lakshminarayan, K.N.; Srivastra, K.K.; Panwar, O.S.; Dumar, A., Amorphous semiconductor devices: memory and switching mechanism, J. Instn Electronic & Telecom. Engrs 27 (1981) 16–19.

Lai, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L. Reversible and irreversible electrical switching in TeO2–V2O5 based glasses, Journal de Physique IV 2 (1992) C2–185—C2–188.

Messoussi, R.; Bernede, J.C.; Benhida, S.; Abachi, T.; Latef, A., Electrical characterzation of M/Se strutures (M=Ni,Bi), Mat. Chem. And Phys. 28 (1991) 253–258.

Mitkova, M.; Boolchand, P., Microscopic orgin of the glass forming tendency in chalcogenides and constraint theory, J. Non–Cryst. Solids 240 (1998) 1–21.

Mitkova, M.; Kozicki, M.N., Silver Incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concering the effect f topology on lectrical switching in chalcogenid network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; La Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semi-conduction glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19(1971) 221–223.

Popescu, C., The Effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.; Choi,W.K.; Snell,A.J.; Owen,A.E., Amorphous silicon analogue memory device, J. Non–Cryst. Solids 115 (1989) 168–170.

Rose, M.J.; Snell, A.J.; Lecomber, P.G.; Hajto, J.; Fitzgerald, A.G.; Owen, A.E., Aspects of non-volatility in a SI:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P. Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys, D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso Internatioanl symposium, Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokal, S.; Satow, T., Thermally Induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vondenicharov, C.; Parvanov.S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sleradzki, K.; Kardynal, B. Kozicki, M.N., Equivalent circuit modeling of the Ag|As0.24S0.36Ag0.40|Ag System prepared by photodissolution of Ag, J. Electrochem. Soc. 145 (1998) 2971–2974.

Zhang, M.; Mancini, S.; Bresser. W.; Boolchand, P., Variation of glass transition temperature, Tg, with average coordination number, <m>, In network glasses: evidence of a threshold behavior in the slope |dTg/d<m>| at the rigidity percolation threshold (<m>+2.4), J. Non–Cryst. Solids 151 (1992) 149–154.

Das et al., *Theory of the characteristic curves of the silver chalcogenide glass inorganic photoresists*, 54 Appl. Phys. Lett., No. 18, pp. 1745–1747 (May 1989).

Helbert et al., *Intralevel hybrid resist process with submicron capability*, SPIE vol. 333 Submicron Lithography pp. 24–29 (1982).

Hilt, Dissertation: *Materials Characterization of Silver Chalcogenide Programmable Metallization Cells*, Arizona State University, pp. title page–114 (UMI Company, May 1999).

Holmquist et al., *Reaction and Diffusion in Silver–Arsenic Chalcogenide Glass Systems*, 62 J. Amer. Ceramic Soc., Nos. 3–4, pp. 183–188 (Mar.–Apr. 1979).

Huggett et al., *Development of silver sensitized germanium selenide photoresist by reactive sputter etching in $SF_6$*, 42 Appl. Phys. Lett., No. 7, pp. 592–594 (Apr. 1983).

Kawaguchi et al., *Mechanism of photosurface deposition*, 164–166 J. Non–Cryst. Solids, pp. 1231–1234 (1993).

McHardy et al., *The dissolution of metals in amorphous chalcogenides and the effects of electron and ultraviolet radiation*, 20 J. Phys. C: Solid State Phys., pp. 4055–4075 (1987).

Miyatani, *Electrical Porperties of $Ag_2Se$*, 13 J. Phys. Soc. Japan, p. 317 (1958).

Mizusaki et al. *Kinetic Studies on the Selenization of Silver*, 47 Bul. Chem. Soc. Japan., No. 11 pp. 2851–2855 (Nov. 1974).

U.S. Appl. No. 10/061,825, filed Jan. 31, 2002, Gilton et al.

U.S. Appl. No. 10/077,867, filed Feb. 20, 2002, Campbell et al.

U.S. Appl. No. 10/232,757, filed Aug. 29, 2002, Li et al.

Owens et al., *Metal–Chalcogenide Photoresists for High Resolution Lithography and Sub–Micron Structures, Nanostructure Physics and Fabrication*, pp. 447–451 (Academic Press, 1989).

Safran et al., *TEM study of $Ag_2Se$ developed by the reaction of polycrystalline silver films and selenium*, 317 Thin Solid Films, pp. 72–76 (1998).

Shimizu et al., *The Photo–Erasable Memory Switching Effect of Ag Photo–Doped Chalcogenide Glasses*, 46 Bul. Chem. Soc. Japan, No. 12, pp. 3662–3665 (Dec. 1973).

Somogyi et al., *Temperature Dependence of the Carrier Mobility in $Ag_2Se$ Layers Grown on NaCl and $SiO_x$ Substrates*, 74 ACTA Physica Hungarica, No. 3, pp. 243–255 (1994).

Tai et al., *Multilevel Ge–Se film based resist systems*, SPIE vol. 333 Submicron Lithography, pp. 32–39 (Mar. 1982).

Tai et al., *Submicron optical lithography using an inorganic resist/polymer bilevel scheme*, 17 J. Vac. Sci. Technol., No. 5, pp. 1169–1176 (Sep./Oct. 1980).

West, Disseration: *Electrically Erasable Non–Volatile Memory Via Electrochemical Deposition of Mulifractal Aggregates*, Arizona State University, pp. title page–168 (UMI Co., May 1998).

West et al., *Equivalent Circuit Modeling of the $Ag|AS_{0.24}S_{0.30}Ag_{0.40}|Ag$ System Prepared by Photodissolution of Ag*, 145 J. Electrochem. Soc., No. 9, pp. 2971–2974 (Sep. 1998).

Yoshikawa et al., *A new inorganic electron resist of high contrast*, 31 Appl. Phys. Lett., No. 3, pp. 161–163 (Aug. 1977).

Yoshikawa et al., *Dry development of Se–Ge Inorganic photoresist*, 36 Appl. Phys. Lett., No. 1, pp. 107–109 (Jan. 1980).

Axon Technologies Corporation, Technology Description: *Programmable Metalization Cell(PMC)*, pp. 1–6 (Pre–May 2000).

El Bouchairi, B.; Bernede, J.C.; Burgaud, P., Properties of $Ag2-xSe1+x/n-Si$ diodes, Thin Solid Films 110 (1983) 107–113.

Hirose et al., *High Speed Memory Behavior and Reliability of Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Kolobov et al., Photodoping of amorphous chalcogenides by metals, Advances in Physics, 1991, vol. 40, No. 5, pp. 625–684.

Kozicki et al., Silver incorporation in thin films of seleniun rich Ge–Se glasses, International Congress on Glass, vol. 2, Extended Abstracts, Jul. 2001, pp. 8–9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal–Doped Chalcogenides, Electrochemical Society Proceedings, vol. 99–13, 1999, pp. 298–309.

Kozicki et al., Nanoscale effects in devices based on chalcogenide solid solutions, Superlattices and Microstructures, vol. 27, No. 516, 2000, pp. 485–488.

Kozicki et al., Nanoscale phase separation in Ag–Ge–Se glasses, Microelectronic Engineering 63 (2002) pp. 155–159.

Owen et al., Metal–Chalcogenide Photoresists for High Resolution Lithography and Sub–Micron Structures, Nanostructure Physics and Fabrication, pp. 447–451 (M. Reed ed. 1989).

West, W.C., Electrically erasable non–volatile memory via electrochemical deposition of multifractal aggregates, Ph.D. Dissertation, ASU 1998.

Yoji Kawamoto et al., "Ionic Conduction in $As_2S_3$–$Ag_2S_1$ $GeSe_2$–$GeS_2$–$Ag_2S$ and $P_2S_5$–$Ag_2S$ Glasses," Journal of Non–Crystalline Solids 20 (1976) 393–404.

\* cited by examiner

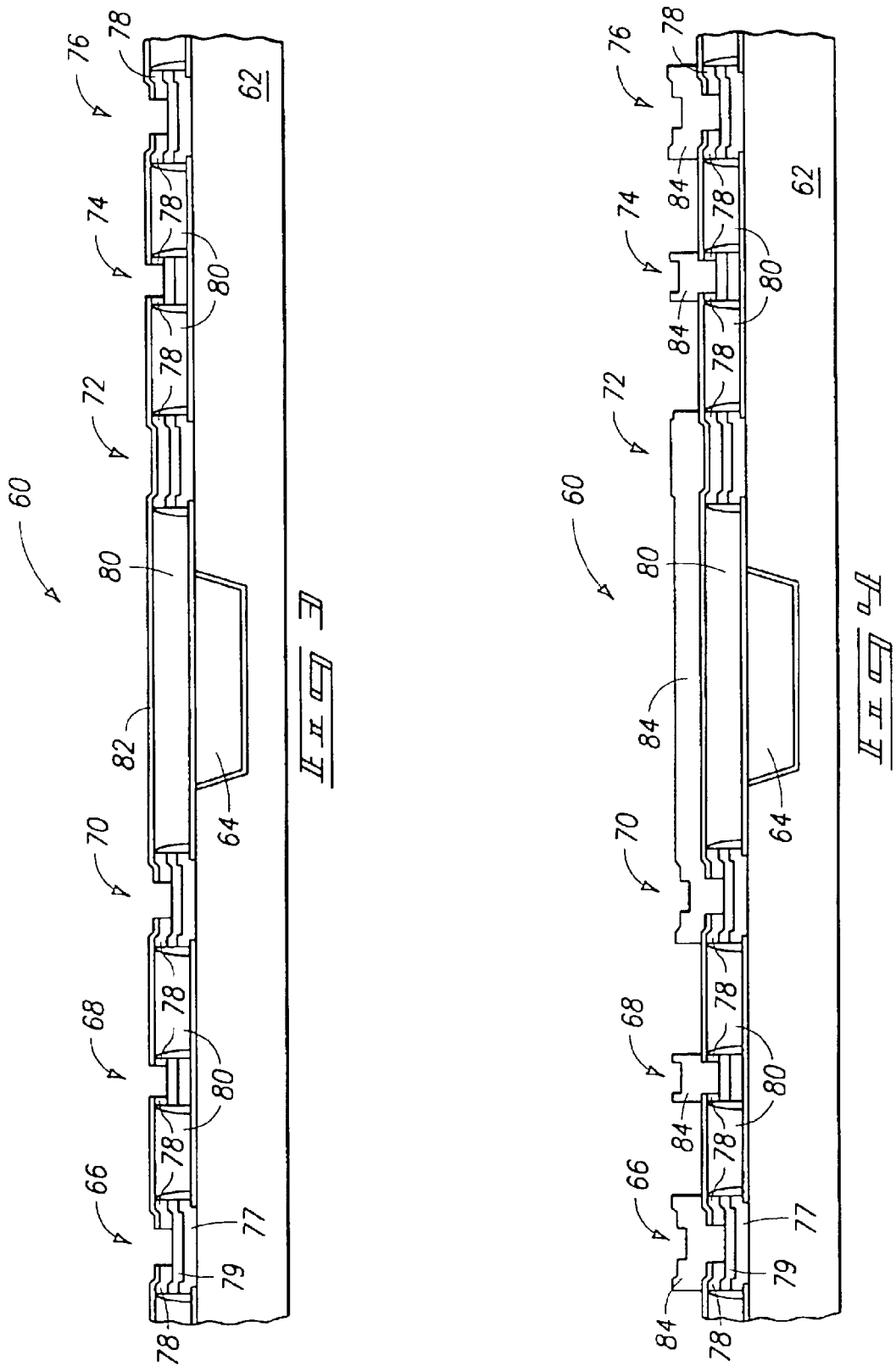

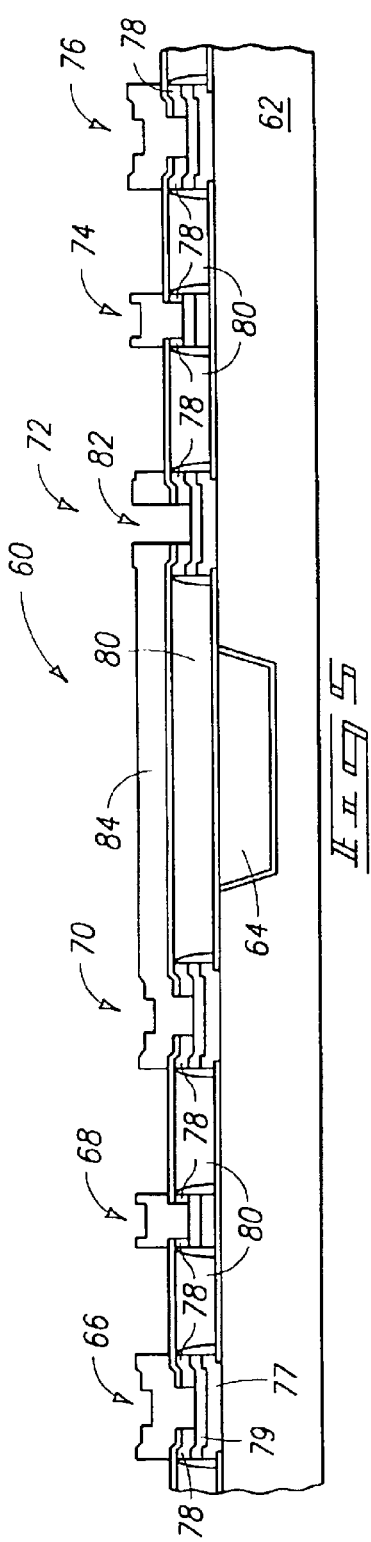

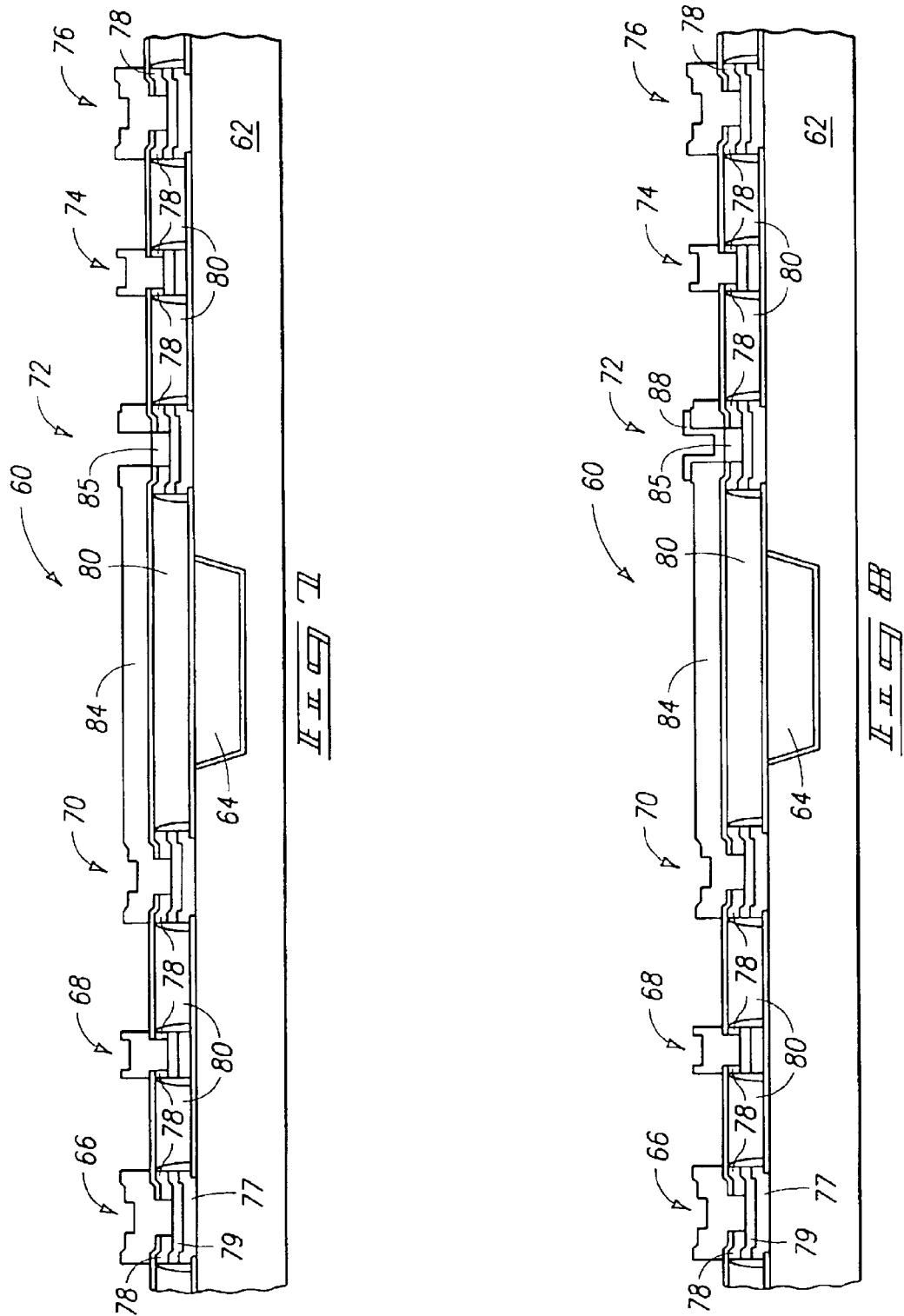

METHOD OF FORMING INTEGRATED CIRCUITRY, METHOD OF FORMING MEMORY CIRCUITRY, AND METHOD OF FORMING RANDOM ACCESS MEMORY CIRCUITRY

TECHNICAL FIELD

This invention relates to methods of forming integrated circuitry, for example memory integrated circuitry.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in the Kozicki et al. U.S. Pat. Nos. 5,761,115; 5,896,312; 5,914,893; and 6,084,796, which ultimately resulted from U.S. patent application Ser. No. 08/652,706, filed on May 30, 1996, disclosing what is referred to as a programmable metallization cell. These patents are hereby incorporated by reference. Such a cell includes opposing electrodes having an insulating dielectric material received therebetween. Received within the dielectric material is a fast ion conductor material. The resistance of such material can be changed between highly insulative and highly conductive states. In its normal high resistive state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the fast ion conductor material is such that it undergoes a chemical and structural change at a certain applied voltage. Specifically, at some suitable threshold voltage, a plating of metal from metal ions within the material begins to occur on the cathode and grows or progresses through the fast ion conductor toward the other anode electrode. With such voltage continued to be applied, the process continues until a single conductive dendrite or filament extends between the electrodes, effectively metal interconnecting the top and bottom electrodes to electrically short them together.

Once this occurs, dendrite growth stops, and is retained when the voltage potentials are removed. Such can effectively result in the resistance of the mass of fast ion conductor material between electrodes dropping by a factor of 1,000. Such material can be returned to its highly resistive state by reversing the voltage potential between the anode and cathode, whereby the filament disappears. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. A specific example is germanium selenide having silver ions diffused therein. The present method of providing the silver ions within the germanium selenide material is to initially chemical vapor deposit the germanium selenide glass without any silver being received therein. A thin layer of silver is thereafter deposited upon the glass, for example by sputtering, physical vapor deposition or other technique. An exemplary thickness is 200 Angstroms or less. The layer of silver is irradiated, preferably with electromagnetic energy at a wavelength less than 500 nanometers. The thin nature of the deposited silver enables such energy to pass through the silver to the silver/glass interface effective to break a chalcogenide bond of the chalcogenide material. This may form $Ag_2Se$, which diffuses into the germanium selenide glass and effectively dopes the glass with silver. The applied energy and overlying silver ultimately result in the silver migrating into the glass layer such that a typical homogenous distribution of silver throughout the layer is achieved.

Saturation of silver in germanium selenide is apparently at about 35 atomic percent. Yet, preferred existing technology for cell fabrication constitutes a concentration which is less than 35%, for example 27%.

After the chalcogenide material is provided with silver to a desired concentration, the top electrode material (typically silver) is next deposited. Subsequently, insulating dielectric layers, such as doped glasses and interlevel dielectric layers are deposited, as are conductive metal interconnect layers. Formation of the conductive metal layers after formation of chalcogenide device components typically results in the substrate being exposed to high temperatures. Unfortunately, this can adversely effect properties of the chalcogenide devices.

It would be desirable to overcome or at least reduce this problem. While the invention was principally motivated in overcoming this problem, it is, in no way so limited. The artisan will appreciate applicability of the invention in other aspects unrelated to the problem, with the invention only being limited by the accompanying claims as literally worded and as appropriately interpreted in accordance with the doctrine of equivalents.

SUMMARY

The invention includes methods of forming integrated circuitry, methods of forming memory circuitry, and methods of forming non-volatile random access memory circuitry. In one implementation, a method of forming memory circuitry sequentially includes forming a plurality of metal interconnect lines over a semiconductive substrate. A plurality of memory cell storage devices comprising voltage or current controlled resistance setable semiconductive material are then formed. In one implementation, a method of forming integrated circuitry includes forming a metal interconnect line over a semiconductive substrate. A device comprising two metal comprising electrodes separated by a voltage or current controlled resistance setable semiconductive material is formed. The resistance setable semiconductive material is formed after forming the metal interconnect line.

Other implementations and aspects are contemplated and disclosed.

BRIEF DESCRIPTION OF THE DRAWINGS

Preferred embodiments of the invention are described below with reference to the following accompanying drawings.

FIG. 3 is a diagrammatic sectional view of an alternate embodiment semiconductor wafer fragment in process in accordance with an aspect of the invention.

FIG. 4 is a view of the FIG. 3 wafer fragment at a processing step subsequent to that shown by FIG. 3.

FIG. 5 is a view of the FIG. 3 wafer fragment at a processing step subsequent to that shown by FIG. 4.

FIG. 6 is a view of the FIG. 3 wafer fragment at a processing step subsequent to that shown by FIG. 5.

FIG. 7 is a view of the FIG. 3 wafer fragment at a processing step subsequent to that shown by FIG. 6.

FIG. 8 is a view of the FIG. 3 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
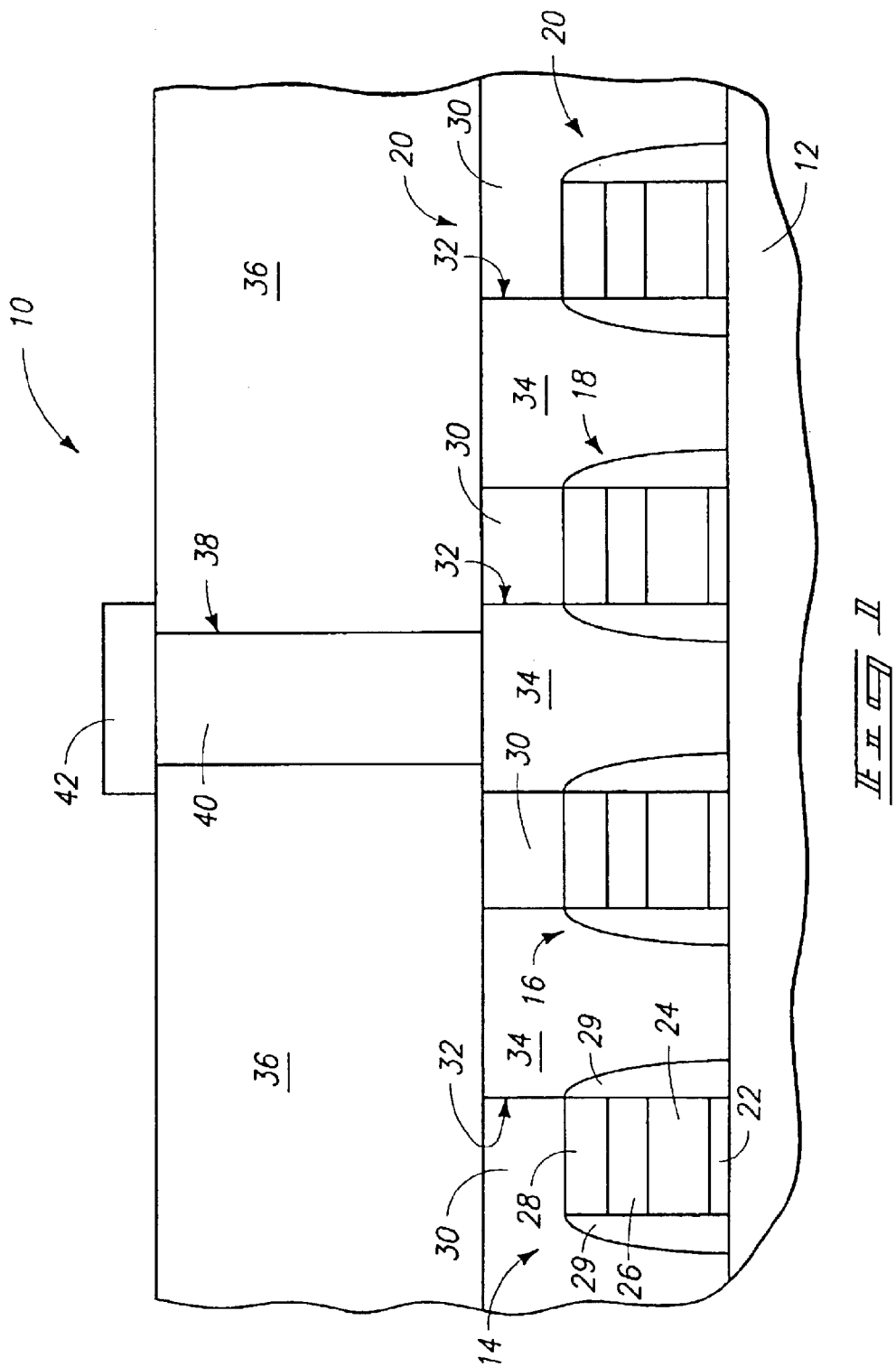
FIG. 1 is a diagrammatic sectional view of a semiconductor wafer fragment in process in accordance with an aspect of the invention.

Referring to FIG. 1, a semiconductor wafer fragment 10 comprises a bulk monocrystalline semiconductive substrate 12 and is shown in but one preferred embodiment of a method of forming integrated circuitry, for example integrated circuitry comprising voltage or current controlled resistance setable material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Further, it will be appreciated by the artisan that "resistance setable material" includes material wherein a property or properties in addition to resistance is/are also varied. For example, and by way of example only, the material's capacitance and/or inductance might also be changed in addition to resistance.

FIG. 1 depicts but one preferred implementation of the invention in a method of forming non-volatile random access memory circuitry. A plurality of memory cell access transistor gates 14, 16, 18 and 20 are formed over semiconductor substrate 12. By way of example only, such comprise a gate dielectric layer 22, an overlying conductively doped polysilicon layer 24, an overlying conductive metal silicide layer 26, an insulative cap 28, and opposing anisotropically etched insulative sidewall spacers 29. In the depicted preferred embodiment, gate constructions 14–20 are in the form of memory cell wordlines. Substrate isolation, for example LOCOS field isolation oxide or trench isolation, is not shown for clarity, and as not constituting particular materiality to the invention. Discussion proceeds with processing particularly material to memory cell wordlines 16 and 18 which are proximate one another.

A planarized insulating layer 30 has been formed over the illustrated transistor gates and substrate 12. An example preferred material is borophosphosilicate glass (BPSG) deposited by chemical vapor deposition and planarized back by a polishing, for example chemical-mechanical polishing. Contact openings 32 have been formed therein to semiconductive substrate 12 and filled with a conductive plugging material 34. An example material for plugging material 34 is conductively doped polysilicon. Of course, conductive metal or metal compound layers might also be formed to constitute some or all of material 34.

Another insulative material layer 36 has been deposited and planarized. Again, BPSG is but one exemplary material for layer 36. In one embodiment, at least one of materials 30 and 36 comprises a boron and/or phosphorus doped silicon dioxide glass comprising layer. Such can also be planarized or otherwise processed by reflow at a temperature of at least 750° C. A contact opening 38 has been formed therethrough to the conductive plugging material 34 which is received between memory cell wordlines 16 and 18. Such has been filled with a conductive plugging material 40. Exemplary materials for material 40 include conductively doped semiconductive materials, such as polysilicon, and metal or metal compounds, and mixtures thereof. At least one metal bit line 42 is formed in electrical connection with material 40 as shown. Thereby in this but one exemplary embodiment, bit line 42 is formed in electrical connection with the active area of semiconductive substrate 12 located between memory cell wordlines 16 and 18. In the context of this document, "metal bit line" defines a conductive bit line which includes at least one of, a) a conductive metal in elemental form; b) a conductive metal alloy comprising at least two elemental metals; and c) a conductive metal compound other than a silicide. By way of example only, exemplary elemental metals and alloys thereof include aluminum, copper, gold, silver, platinum, palladium and rhodium. By way of example only, exemplary metal compounds include titanium nitride and conductive metal oxides, such as rhodium oxides. In accordance with typical or yet-to-be-developed processing, multiple bit lines 42 would typically be fabricated, with only one such bit line 42 being shown in the depicted cross-section. In one embodiment, such constitutes the first metal layer formed over the substrate and, in some instances, is referred to as the Metal 1 layer by people of skill in the art.

In one considered implementation, metal bit line 42 constitutes a metal interconnect line which is formed over the substrate and memory cell access transistor gates. In the context of this document, "metal interconnect line" defines at least one conductive line which is not a transistor gate line and which electrically connects at least two devices and includes at least one of, a) a conductive metal in element form; b) a conductive metal alloy comprising at least two elemental metals; and c) a conductive metal compound other than a silicide. Of course, interconnect lines 42 might also comprise a conductive metal silicide portion in addition to at least one of the materials referred to above. Examples include titanium silicides and tungsten silicides. Further, interconnect lines 42 might include any combination or mixtures of conductive elemental metals, metal alloys comprising at least two elemental metals, at least one conductive metal compound other than a silicide, and a conductive metal silicide. Further, the metal interconnect lines might consist essentially of any of these materials, alone or in combination.

Figure 2:
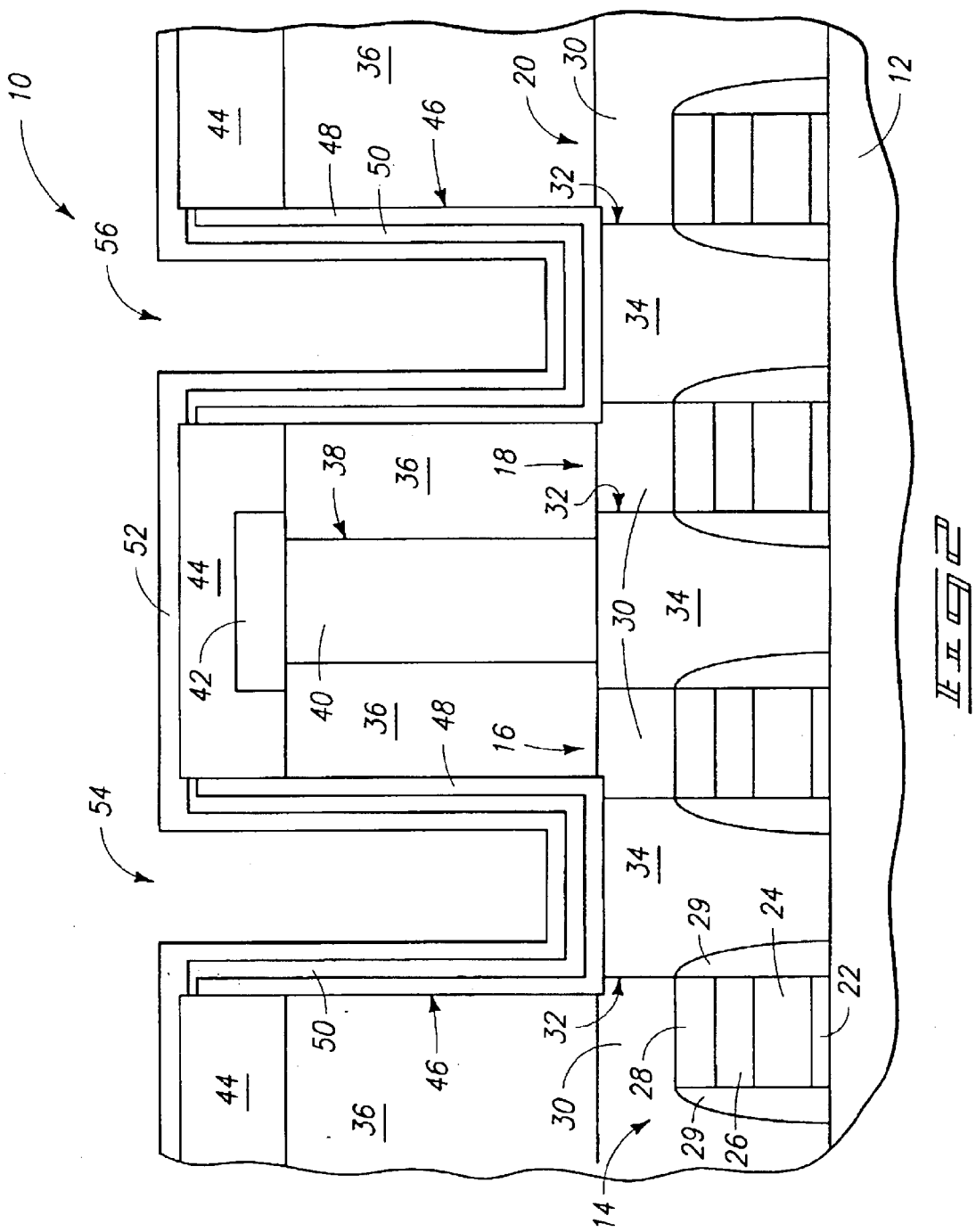
FIG. 2 is a view of the FIG. 1 wafer fragment at a processing step subsequent to that shown by FIG. 1.

Referring to FIG. 2, an interlevel dielectric layer 44 is formed over dielectric layer 36 and metal interconnect lines/bit lines 42. Exemplary materials include undoped silicon dioxide and silicon nitride. Container openings 46 are etched into insulating materials 44 and 36 to the conductive plugging material 34 which is received on respective lateral outer sides of wordlines 16 and 18. Respective first memory cell electrodes 48 are formed within container openings 46 and, accordingly, in electrical connection with active area of semiconductive substrate 12 on respective lateral outer sides of wordlines 16 and 18. Accordingly, the exemplary respective first memory cell electrodes are formed in electrical connection with respective memory cell access transistors incorporating the illustrated memory cell access transistor gates. Source/drain regions (not shown) would be provided within or proximate semiconductive substrate 12. Exemplary preferred materials for first electrodes 48 include elemental metals, metal alloys and conductive metal compounds. Exemplary preferred materials include silver, for example silver in elemental or alloy form. Such material would preferably be deposited by physical or chemical vapor deposition, planarize polished back, and then recess etched to slightly below the outermost surface of interlevel dielectric layer 44, as shown.

A voltage or current controlled resistance setable semiconductive material 50 is formed in electrical connection with the respective first at electrodes 48. Exemplary resistance setable semiconductive material includes chalcogenide material having metal ions diffused therein. One exemplary material comprises $Ge_xA_y$, where "A" is selected from the group consisting of Se, Te, S, and mixtures thereof. Exemplary preferred metal ions within material 50 include silver ions. An example preferred method for forming material 50 is by chemical vapor deposition followed by a thin metal layer deposition thereon (i.e., preferably to less than 30% of the thickness of material 50). Exemplary preferred materials for the metal include silver and copper. Such metal is then preferably irradiated effective to break a chalcogenide bond of the chalcogenide material at an interface of such metal and chalcogenide material, and diffuse at least some of the metal into the chalcogenide material to diffuse metal ions therein. A preferred irradiating includes exposure to actinic radiation having a wavelength of from about 164–904 nanometers, with radiation exposure at between 404–408 nanometers being a more specific example. An even more specific example is a flood UV exposure tool operating at 4.5 milliwatts/cm$^2$ energy for 15 minutes in an oxygen-containing ambient at room temperature and pressure. The thickness of the metal layer is also preferably chosen to be suitably thin to enable the impinging electromagnetic radiation to essentially transparently pass through such metal to the interface of such metal with the chalcogenide material. Such layer is ultimately preferably planarized and recess etched back slightly relative to interlevel dielectric layer 44, as shown.

At least one second memory cell electrode 52 is formed in electrical connection with voltage or current controlled resistance setable material 50. In the preferred embodiments, such results in the formation of the depicted at least two non-volatile random access memory cells 54 and 56. In such depicted preferred embodiments, second memory cell electrode 52 is common to each of memory cells 54 and 56, and preferably common to other memory cells which are formed. Further in one preferred and the depicted preferred embodiment, first memory cell electrodes, the resistance setable semiconductive material, and the second memory cell electrode(s) are formed into respective memory cell container shapes. Further preferably in one embodiment, the metal ions received within chalcogenide material 50 include silver, and preferably at least one of the first and second electrodes comprises silver and more preferably silver in elemental form.

Such provides but a few examples of forming integrated circuitry, such as memory circuitry, in accordance with but some aspects of the invention, with memory cells 54 and 56 constituting but exemplary memory cell storage devices comprising voltage or current controlled resistance setable semiconductive material. Yet in one aspect, the invention comprises a method of forming any memory circuitry which sequentially comprises the formation of some plurality of metal interconnect lines over a semiconductive substrate followed by the formation of a plurality of memory cell storage devices comprising voltage or current controlled resistance setable semiconductive material. Further considered, the invention comprises any method of forming integrated circuitry (whether existing or yet-to-be-developed) which sequentially comprises forming at least one metal interconnect line over a semiconductive substrate followed by the formation of any device comprising two metal comprising electrodes separated by a voltage or current controlled resistance setable semiconductive material.

These and other aspects of the invention are also considered and contemplated by way of example only with respect to but one exemplary alternate embodiment depicted in FIGS. 3–8. FIG. 3 depicts a wafer fragment 60 comprising a bulk semiconductive substrate 62 having an exemplary shallow trench field isolation region 64 formed therein. Various exemplary conductive device components 66, 68, 70, 72, 74 and 76 are shown as being formed over substrate 62. Such might constitute completed devices or devices in fabrication in the form of conductive lines, such as interconnect lines or field effect transistor lines, or any other conductive device or component thereof. By way of illustration and example only, such device components are depicted as having conductive polysilicon portions 77, overlying metal portions 79, and insulative silicon nitride caps 78. A dielectric layer 80 has been deposited, and planarized back. An exemplary silicon nitride layer 82 is formed thereover. Exemplary contact openings have been formed through layers 82 and 78 with respect to conductive device components 66, 68, 70, 74 and 76.

Referring to FIG. 4, a conductive layer is deposited and patterned to form at least one metal interconnect line 84 over the illustrated two conductive device components 70 and 72. Such is preferably formed by suitable metal, metals, or metal compound(s) deposition/formation, followed by photolithographic patterning and etch. Exemplary materials for the subject metal layer include tungsten nitride, tungsten, nickel, copper and mixtures thereof. Such provides but one example of forming a metal interconnect line over two conductive device components in the context of but one aspect of the invention.

Referring to FIG. 5, at least one opening 82 is formed through metal interconnect line 84 to at least one of the two conductive device components, with only a single opening 82 being shown formed to conductive device component 72. Preferred methods by which opening 82 is formed include photolithography and etching of metal interconnect line 80.

Referring to FIG. 6 a preferred chalcogenide comprising material 85 is deposited as shown. Such material is patterned, polished or etched back (FIG. 7) by wet or dry processes. Metal ion insertion/doping thereof is preferably conducted as part of the FIG. 6 processing or as part of the FIG. 7 processing, and is preferably conducted by way of example only by metal layer irradiation as described above. Regardless, such provides but one example of forming voltage or current controlled resistance setable semiconductive material 85 within opening 82 in electrical connection with the respective one of the exemplary subject two device components 70 and 72, with the depicted example showing such material being formed to only partially fill opening 82.

Referring to FIG. 8, a conductive material 88 is formed within opening 82 in electrical connection with resistance setable semiconductive material 85 and in electrical connection with metal interconnect line 84. Preferably in connection with the above-described preferred embodiments, at least one of the conductive material 88 and that of device component 72 comprises silver, and more preferably elemental silver. Any other alternate conductive material, whether existing or yet-to-be-developed, is also contemplated, of course. As shown in one preferred embodiment, conductive material 88 is formed to less than completely fill remaining portions of opening 82, with a preferred container shape being formed as shown in FIG. 8.

Such provides but one example of forming voltage or current controlled resistance setable semiconductive material 84 within opening 82 in electrical connection with the respective one of the two device components and in electrical connection with metal interconnect line 84 with, in the depicted preferred embodiment, such being provided by the provision of a conductive material 88.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming memory circuitry sequentially comprising:
   (a) forming select and access circuitry over a semiconductor substrate including a plurality of metal interconnect lines; and
   (b) after step (a), forming a plurality of memory cell storage devices, said step of forming a plurality of memory cell storage devices comprising:
      (b1) forming respective bottom electrodes for said plurality of memory cell storage devices;
      (b2) after step (b1), forming respective voltage or current controlled resistance settable semiconductive material for said plurality of memory cell storage devices; and
      (b3) after step (b2), forming respective top electrodes for said plurality of memory memory cell storage devices.

2. The method of claim 1 wherein the metal interconnect lines comprise a conductive elemental metal or metal alloy comprising at least two elemental metals.

3. The method of claim 1 wherein the metal interconnect lines comprise at least one conductive metal compound other than a silicide.

4. The method of claim 1 wherein the metal interconnect lines comprise a conductive metal silicide.

5. The method of claim 1 wherein the metal interconnect lines comprise:
   a conductive elemental metal or metal alloy comprising at least two elemental metals; and
   at least one conductive metal compound other than a conductive metal silicide.

6. The method of claim 1 wherein said resistance setable semiconductive material comprises chalcogenide material having metal ions diffused therein.

7. The method of claim 6 wherein the chalcogenide material having metal ions diffused therein comprises $Ge_xA_y$, where A is selected from the group consisting of Se, Te and S, and mixtures thereof.

8. A method of forming memory circuitry sequentially comprising:
   (a) forming a plurality of memory cell access transistor gates over a semiconductor substrate;
   (b) forming a plurality of a metal interconnect lines over the substrate and the memory cell access transistor gates; and
   (c) forming a plurality of memory cell storage devices comprising voltage or current controlled resistance setable semiconductive material;
   wherein step (c) is performed after steps (a) and (b), and step (b) is performed after step (a).

9. The method of claim 8 wherein said resistance settable semiconductive material comprises chalcogenide material having metal ions diffused therein.

10. The method of claim 9 wherein the chalcogenide material having metal ions diffused therein comprises $Ge_xA_y$, where A is selected from the group consisting of Se, Te and S, and mixtures thereof.

11. A method of forming random access memory circuitry comprising:
   forming a plurality of memory cell access transistor gates over a semiconductor substrate;
   forming a plurality of metal interconnect lines over the substrate and the memory cell access transistor gates;
   after forming the conductive metal interconnect lines, forming respective first memory cell electrodes in electrical connection with respective memory cell access transistors incorporating the memory cell access transistor gates;
   forming voltage or current controlled resistance setable semiconductive material in electrical connection with the respective first electrodes; and
   forming at least one second memory cell electrode in electrical connection with the voltage or current controlled resistance setable material.

12. The method of claim 11 wherein said resistance settable semiconductive material comprises chalcogenide material having silver ions diffused therein.

13. The method of claim 12 wherein at least one of the first and second electrodes comprises silver.

14. The method of claim 12 wherein at least one of the first and second electrodes comprises elemental silver.

15. The method of claim 11 comprising after forming the memory cell access transistor gates and before forming the respective first memory cell electrodes, depositing a boron and/or phosphorus doped silicon dioxide glass comprising layer, and reflowing it at a temperature of at least 750° C.

16. A method of forming at least two random access memory cells comprising:
   forming at least two memory cell wordlines over a semiconductor substrate, the two memory call wordlines being proximate one another;
   forming at least one metal bit one in electrical connection with active area of the semiconductive substrate which is between the two memory cell wordlines;
   after forming the metal bit line, forming respective first memory cell electrodes in electrical connection with active area of the semiconductive substrate on respective lateral outer sides of the at least two wordlines;
   forming voltage or current controlled resistance setable semiconductive material in electrical connection with the respective first electrodes; and forming a second memory cell electrode in electrical connection with the voltage or current controlled resistance setable material, the second memory cell electrode being common to the two memory cells being formed.

17. The method of claim 16 comprising forming the first memory cell electrodes, said resistance setable semiconductive material, and the second memory cell electrode into respective memory cell container shapes.

18. The method of claim 16 wherein said resistance setable semiconductive material comprises chalcogenide material having silver ions diffused therein.

19. The method of claim 18 wherein at least one of the first and second electrodes comprises silver.

20. The method of claim 18 wherein at least one of the first and second electrodes comprises elemental silver.

21. A method of forming integrated circuitry comprising:
    forming a metal interconnect line over a semiconductive substrate; and
    forming a device comprising two metal comprising electrodes separated by a voltage or current controlled resistance setable semiconductive material, said resistance setable semiconductive material being formed after forming the metal interconnect line.

22. The method of claim 21 wherein the metal interconnect line comprises a conductive elemental metal or metal alloy comprising at least two elemental metals.

23. The method of claim 21 wherein the metal interconnect line comprises at least one conductive metal compound other than a silicide.

24. The method of claim 21 wherein the metal interconnect line consists essentially of a conductive elemental metal or metal alloy comprising at least two elemental metals.

25. The method of claim 21 wherein the metal interconnect lines consists essentially of a conductive metal compound other than a silicide.

26. The method of claim 21 wherein said resistance setable semiconductive material comprises chalcogenide material having metal ions diffused therein.

27. The method of claim 26 wherein the chalcogenide material having metal ions diffused therein comprises $Ge_xA_y$, where A is selected from the group consisting of Se, Te and S, and mixtures thereof.

28. The method of claim 21 wherein the metal interconnect line comprises both a) a conductive elemental metal or metal alloy comprising at least two elemental metals, and b) at least one conductive metal compound other than a silicide.

29. The method of claim 21 wherein the device comprises at least a portion of a memory cell.

30. A method of forming integrated circuitry comprising:
    forming at least two conductive device components over a semiconductor substrate;
    forming a metal interconnect line over the two conductive device components;
    forming at least one opening through the metal interconnect line to at least one of the two conductive device components; and
    forming voltage or current controlled resistance setable semiconductive material within the opening in electrical connection with a respective one of the two device components and in electrical connection with the metal interconnect line.

31. The method of claim 30 wherein at least one of the device components comprises a conductive line.

32. The method of claim 30 wherein forming the opening comprises photolithography and etching of the metal interconnect line.

33. The method of claim 30 wherein said resistance settable semiconductive material comprises chalcogenide material having silver ions diffused therein.

34. The method of claim 33 wherein at least one of the device components comprises silver.

35. The method of claim 33 wherein at least one of the device components comprises elemental silver.

36. A method of forming integrated circuitry comprising:
    forming at least two conductive device components over a semiconductor substrate;
    forming a metal interconnect line over the two conductive device components;
    forming at least one opening through the metal interconnect line to at least one of the two conductive device components;
    forming voltage or current controlled resistance setable semiconductive material within the opening in electrical connection with a respective one of the two device components said resistance setable semiconductive material being formed to only partially fill the opening; and
    forming a conductive material within the opening in electrical connection with said resistance setable semiconductive material and the metal interconnect line.

37. The method of claim 36 wherein the conductive material is formed to less than completely fill remaining portions of the opening.

38. The method of claim 36 wherein the conductive material is formed to less than completely fill remaining portions of the opening, and to form a container shape.

39. The method of claim 36 wherein the conductive material comprises silver.

40. The method of claim 36 wherein the conductive material comprises elemental silver.

41. The method of claim 36 wherein said resistance settable semiconductive material comprises chalcogenide material having metal ions diffused therein.

42. The method of claim 41 wherein the chalcogenide material having metal ions diffused wherein comprises $Ge_xA_y$, where A is selected from the group consisting of Se, Te and S, and mixtures thereof.

43. The method of claim 36 wherein said resistance settable semiconductive material comprises chalcogenide material having silver ions diffused therein.

44. The method of claim 43 wherein the conductive material comprises silver.

45. The method of claim 43 wherein the conductive material comprises elemental silver.

46. A method of forming memory circuitry sequentially comprising:
    (a) forming select and access circuitry including a plurality of metal interconnect lines over a semiconductive substrate; and
    (b) forming a plurality of memory cell storage devices comprising chalcogenide material;
    wherein step (b) is performed after step (a).

47. The method of claim 46 wherein the memory cell storage devices respectively comprise two electrodes separated by said chalcogenide material.

48. The method of claim 46 wherein the metal interconnect lines comprise a conductive elemental metal or metal alloy comprising at least two elemental metals.

49. The method of claim 46 wherein the metal interconnect lines comprise at least one conductive metal compound other than a silicide.

50. The method of claim 46 wherein the metal interconnect lines comprise a conductive metal silicide.

51. The method of claim 46 wherein the metal interconnect lines comprise both a) a conductive elemental metal or metal alloy comprising at least two elemental metals, and b) at least one conductive metal compound other than a conductive metal silicide.

52. A method of forming memory circuitry sequentially comprising:
   (a) forming a plurality of memory cell access transistor gates over a semiconductor substrate;
   (b) forming a plurality of a metal interconnect lines over the substrate and the memory cell access transistor gates; and
   (c) forming a plurality of memory cell storage devices comprising chalcogenide material;
   wherein step (c) is performed after steps (a) and (b).

53. The method of claim 52 wherein the chalcogenide material comprises $Ge_xA_y$, where A is selected from the group consisting of Se, Te and S, and mixtures thereof.

54. A method of forming random access memory circuitry comprising:
   forming a plurality of memory cell access transistor gates over a semiconductor substrate;
   forming a plurality of metal interconnect lines over the substrate and the memory cell access transistor gates;
   after forming the conductive metal interconnect lines, forming respective first memory cell electrodes in electrical connection with respective memory cell access transistors incorporating the memory cell access transistor gates;
   forming chalcogenide comprising material in electrical connection with the respective first electrodes; and
   forming at least one second memory cell electrode in electrical connection with the chalcogenide comprising material.

55. The method of claim 54 wherein said chalcogenide comprising material has silver ions diffused therein.

56. The method of claim 55 wherein at least one of the first and second electrodes comprises silver.

57. The method of claim 55 wherein at least one of the first and second electrodes comprises elemental silver.

58. The method of claim 54 comprising after forming the memory cell access transistor gates and before forming the respective first memory cell electrodes, depositing a boron and/or phosphorus doped silicon dioxide glass comprising layer, and reflowing it at a temperature of at least 750° C.

59. A method of forming at least two random access memory cells comprising:
   forming at least two memory cell wordlines over a semiconductor substrate, the two memory cell wordlines being proximate one another;
   forming at least one metal bit line in electrical connection with active area of the semiconductive substrate which is between the two memory cell wordlines;
   after forming the metal bit line, forming respective first memory cell electrodes in electrical connection with active area of the semiconductive substrate on respective lateral outer sides of the two wordlines;
   forming chalcogenide comprising material in electrical connection with the respective first electrodes; and
   forming a second memory cell electrode in electrical connection with the chalcogenide comprising material the second memory cell electrode being common to the two memory cells being formed.

60. The method of claim 59 comprising forming the first memory cell electrodes, said chalcogenide comprising material, and the second memory cell electrode into respective memory cell container shapes.

61. The method of claim 59 wherein said chalcogenide comprising material has silver ions diffused therein.

62. The method of claim 61 wherein at least one of the first and second electrodes comprises silver.

63. The method of claim 61 wherein at least one of the first and second electrodes comprises elemental silver.

64. A method of forming integrated circuitry comprising:
   forming a metal interconnect line over a semiconductive substrate; and
   forming a device comprising two metal comprising electrodes separated by a chalcogenide comprising material, said chalcogenide comprising material being formed after forming the metal interconnect line.

65. The method of claim 64 wherein the metal interconnect line comprises a conductive elemental metal or metal alloy comprising at least two elemental metals.

66. The method of claim 64 wherein the metal interconnect line comprises at least one conductive metal compound other than a silicide.

67. The method of claim 64 wherein the metal interconnect line consists essentially of a conductive elemental metal or metal alloy comprising at least two elemental metals.

68. The method of claim 64 wherein the metal interconnect lines consists essentially of a conductive metal compound other than a silicide.

69. The method of claim 64 wherein the chalcogenide comprising material comprises $Ge_xA_y$, where A is selected from the group consisting of Se, Te and S, and mixtures thereof.

70. The method of claim 64 wherein the metal interconnect line comprises both a) a conductive elemental metal or metal alloy comprising at least two elemental metals, and b) at least one conductive metal compound other than a silicide.

71. The method of claim 64 wherein the device comprises at least a portion of a memory cell.

72. A method of forming integrated circuitry comprising:
   forming at least two conductive device components over a semiconductor substrate;
   forming a metal interconnect line over the two conductive device components;
   forming at least one opening through the metal interconnect line to at least one of the two conductive device components; and
   forming chalcogenide comprising material within the opening in electrical connection with a respective one of the two device components and in electrical connection with the metal interconnect line.

73. The method of claim 72 wherein at least one of the device components comprises a conductive line.

74. The method of claim 72 wherein forming the opening comprises photolithography and etching of the metal interconnect line.

75. The method of claim 72 wherein said chalcogenide comprising material has silver ions diffused therein.

76. The method of claim 75 wherein at least one of the device components comprises silver.

77. The method of claim 75 wherein at least one of the device components comprises elemental silver.

78. A method of forming integrated circuitry comprising:
   forming at least two conductive device components over a semiconductor substrate;
   forming a metal interconnect line over the two conductive device components;
   forming at least one opening through the metal interconnect line to at least one of the two conductive device components;

forming chalcogenide comprising material within the opening in electrical connection with a respective one of the two device components, said chalcogenide comprising being formed to only partially fill the opening; and forming a conductive material within the opening in electrical connection with said chalcogenide comprising material and the metal interconnect line.

79. The method of claim 78 wherein the conductive material is formed to less than completely fill remaining portions of the opening.

80. The method of claim 78 wherein the conductive material is formed to less than completely fill remaining portions of the opening, and to form a container shape.

81. The method of claim 78 wherein the conductive material comprises silver.

82. The method of claim 78 wherein the conductive material comprises elemental silver.

83. The method of claim 78 wherein said chalcogenide comprising material has metal ions diffused therein.

84. Tho method of claim 83 wherein the chalcogenide material having metal ions diffused therein comprises $Ge_xA_y$, where A is selected from the group consisting of Se, Te and S, and mixtures thereof.

85. The method of claim 78 wherein said chalcogenide comprising material has silver ions diffused therein.

86. The method of claim 85 wherein the conductive material comprises silver.

87. The method of claim 85 wherein the conductive material comprises elemental silver.

* * * * *

UNITED STATES PATENT AND TRADEMARK OFFICE
CERTIFICATE OF CORRECTION

| | |
|---|---|
| PATENT NO. | : 6,951,805 B2 |
| APPLICATION NO. | : 09/921,518 |
| DATED | : October 4, 2005 |
| INVENTOR(S) | : John T. Moore |

It is certified that error appears in the above-identified patent and that said Letters Patent is hereby corrected as shown below:

Column 3, line 56, "spacers 29" should read --spacers 30--.
TITLE Pg. ITEM (56)
In the Other Publications portion of the References Cited section the following errors are corrected:

"Alekperova, Sh.M.; Gadshleva, G.S., Current-Voltage characteristics of $Ag_2Se$ single crystal near the phase transition, Inorganic Materials 23 (1987) 137-139."

Should read

--Alekperova, Sh.M.; Gadzhieva, G.S., Current-voltage characteristics of $Ag_2Se$ single crystal near the phase transition, Inorganic Materials 23 (1987) 137-139.--;

"Aleksiejunas, A.; Cesnys, A., Swithcing phenomenon and memory effect in thin-film heterojunction of polycrystalline selenium-silver selenide, Phys. Stat. Sol. (a) 19(1973) K169-171."

Should read

--Aleksiejunas, A.; Cesnys, A., Switching phenomenon and memory effect in thin-film heterojunction of polycrystalline selenium-silver selenide, Phys. Stat. Sol. (a) 19(1973) K169-171.--;

"Boolchand, P.; Basser, W.J. Mobile silver ions and glass formation in solid electrolytes, Nature 410 (2001) 1070-1073."
Should read
--Boolchand, P.; Bresser, W.J., Mobile silver ions and glass formation in solid electrolytes, Nature 410 (2001) 1070-1073.--;

"Gates, B.; Wu, Y.; Yang. P.; Xia, Y., Single-crystalline nanowires of $Ag_2Se$ can be synthesized by templating against nanowires of trigonal Se, J. Am. Chem. Soc. (2001) currently ASAP."

Should read
--Gates, B.; Wu, Y.; Yin, Y.; Yang. P.; Xia, Y., Single-crystalline nanowires of $Ag_2Se$ can be synthesized by templating against nanowires of trigonal Se, J. Am. Chem. Soc. (2001) currently ASAP.--;

UNITED STATES PATENT AND TRADEMARK OFFICE
CERTIFICATE OF CORRECTION

| | |
|---|---|
| PATENT NO. | : 6,951,805 B2 |
| APPLICATION NO. | : 09/921,518 |
| DATED | : October 4, 2005 |
| INVENTOR(S) | : John T. Moore |

It is certified that error appears in the above-identified patent and that said Letters Patent is hereby corrected as shown below:

"Hajto, J.; McAuley, B.; Snell, A.J.; Owen, A.E., Theory of room temperature quantized resistance effects in metal-a-Si:H-metal thin film structures, J. Non-Cryst. Solids 198-200 (1998) 825-828."

Should read
--Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.--;

"Kawaguchi, T.; Masui, K., Analysis of chang in optical transmission spectra resulting from Ag photodoping in chalcogenid film, Japan J. Appl. Phys. 26 (1987) 15-21."

Should read
--Kawaguchi, T.; Masui, K., Analysis of change in optical transmission spectra resulting from Ag photodoping in chalcogenide film, Japan J. Appl. Phys. 26 (1987) 15-21.--;

"Narayanan, R.A.; Asokan, S.; Kumar, A., Evidence concerning the effect f topology on lectrical switching in chalcogenid network glasses, Phys. Rev. B 54 (1996) 4413-4415."

Should read
--Narayanan, R.A.; Asokan, S.; Kumar, A., Evidence concerning the effect of topology on electrical switching in chalcogenide network glasses, Phys. Rev. B 54 (1996) 4413-4415.--;

"Tranchant, S.; Peytavin, S.; Ribes, M.; Flank, A.M.; Dexpert, H.; Lagarde, J.P., Siver chalcogenide glasses Ag-Ge-Se: Ionic conduction and exafs structural investigation, Transport-structure relations in fast ion and mixed conductors Proceedings of the 6th Riso Internatioanl symposium, Sep. 9-13, 1985."

Should read
--Tranchant, S.; Peytavin, S.; Ribes, M.; Flank, A.M.; Dexpert, H.; Lagarde, J.., Silver chalcogenide glasses Ag-Ge-Se: Ionic conduction and EXAFS structural investigation, Transport-structure relations in fast ion and mixed conductors Proceedings of the 6th Riso International symposium, Sep. 9-13, 1985.--;

"Uemura, O.; Kameda, Y.; Kokai, S.; Satow, T., Thermally Induced crystallization of amorphous $Ge_{0.4}Se_{0.6}$, J. Non-Cryst. Solids 117-118 (1990) 219-221."

UNITED STATES PATENT AND TRADEMARK OFFICE
CERTIFICATE OF CORRECTION

PATENT NO. : 6,951,805 B2
APPLICATION NO. : 09/921,518
DATED : October 4, 2005
INVENTOR(S) : John T. Moore Page 3 of 3

It is certified that error appears in the above-identified patent and that said Letters Patent is hereby corrected as shown below:

Should read
--Uemura, O.; Kameda, Y.; Kokai, S.; Satow, T., Thermally Induced crystallization of amorphous $Ge_{0.4}Se_{0.6}$, J. Non-Cryst. Solids 117-118 (1990) 219-221.--;

"West, W.C.; Sleradzki, K.; Kardynal, B.; Kozicki, M.N., Equivalent circuit modeling of the $Ag|As_{0.24}S_{0.36}Ag_{0.40}|Ag$ System prepared by photodissolution of Ag, J. Electrochem. Soc. 145 (1998) 2971-2974."

Should read

--West, W.C.; Sieradzki, K.; Kardynal, B.; Kozicki, M.N., Equivalent circuit modeling of the $Ag|As_{0.24}S_{0.36}Ag_{0.40}|Ag$ System prepared by photodissolution of Ag, J. Electrochem. Soc. 145 (1998) 2971-2974.--;

"Yoji Kawamoto et al., "Ionic Conduction in $As_2S_3$-$Ag_2S_1GeS_2$-GeS+- $Ag_2S$ and $P_2S_5$-$Ag_2S$ Glasses," Journal of Non-Crystalline Solids 20 (1976) 393-404."

Should read
--Yoji Kawamoto et al., "Ionic Conduction in $As_2S_3$-$Ag_2S_1GeSe_2$-GeS- $Ag_2S$ and $P_2S_5$-$Ag_2S$ Glasses," Journal of Non-Crystalline Solids 20 (1976) 393-404.--; and "Miyatani, *Electrical Porperties of Ag₂Se*, 13 J. Phys. Soc. Japan, p. 317 (1958)."
Should read
--Miyatani, *Electrical Properties of $Ag_2Se$*, 13 J. Phys. Soc. Japan, p.317

Signed and Sealed this

Fifteenth Day of August, 2006

JON W. DUDAS
*Director of the United States Patent and Trademark Office*